United States Patent
Chao et al.

(10) Patent No.: US 8,552,711 B2
(45) Date of Patent: Oct. 8, 2013

(54) DEVICE FOR TESTING SERIAL ATTACHED SMALL COMPUTER SYSTEM INTERFACE SIGNAL

(75) Inventors: Hung Chao, Taipei Hsien (TW); Cheng-Chung Huang, Taipei Hsien (TW); Jui-Hsiung Ho, Taipei Hsien (TW); Wang-Ding Su, Taipei Hsien (TW); Po-Kai Huang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 363 days.

(21) Appl. No.: 12/916,601

(22) Filed: Oct. 31, 2010

(65) Prior Publication Data

US 2012/0007587 A1 Jan. 12, 2012

(30) Foreign Application Priority Data

Jul. 8, 2010 (TW) .............................. 99122422 A

(51) Int. Cl.
*G01R 13/34* (2006.01)
(52) U.S. Cl.
USPC .................................................... 324/121 R
(58) Field of Classification Search
USPC .................. 324/121 R, 756.04, 756.05, 538, 324/121; 439/502
See application file for complete search history.

(56) References Cited

U.S. PATENT DOCUMENTS

| D504,079 | S  | * | 4/2005  | Wrisley ........................ D10/76 |
| 7,431,615 | B2 | * | 10/2008 | Ho ................................. 439/578 |
| 2005/0272303 | A1 | * | 12/2005 | Wu ................................. 439/499 |
| 2007/0101207 | A1 | * | 5/2007  | Lin et al. ........................ 714/56 |
| 2008/0309349 | A1 | * | 12/2008 | Sutono .......................... 324/537 |
| 2010/0085362 | A1 | * | 4/2010  | Tan ............................... 345/440 |

OTHER PUBLICATIONS

Wilder Technologies, SAS Test Adapter User Manual.*
RP-3000-1B.*
RP-3252-1B.*
Yokogawa_DL7480.*

* cited by examiner

*Primary Examiner* — Tung X Nguyen
(74) *Attorney, Agent, or Firm* — Altis Law Group, Inc.

(57) ABSTRACT

A signal testing device includes an oscillograph having a plurality of first connection ports, and a signal transmitting cable. The signal transmitting cable includes a plurality of second connection ports, a plurality of coaxial cables and a SAS connector configured for connecting to a mother board. One end of each coaxial cable is electrically connected to a corresponding one of the second connection ports, and the other end is electrically connected to the SAS connector. The first connection ports are configured for engaging with the second connection ports.

14 Claims, 3 Drawing Sheets

DEVICE FOR TESTING SERIAL ATTACHED SMALL COMPUTER SYSTEM INTERFACE SIGNAL

BACKGROUND

1. Technical Field

The present disclosure relates to signal testing devices and, particularly, to a device for testing serial attached small computer system interface (SAS) signal.

2. Description of Related Art

SAS connectors are usually electrically mounted to a mother board for connecting a hardware disk to the mother board. SAS signals are analyzed using eye diagrams, for such things as a slew rate, and a jitter of the mother board. Conventional SAS signal testing devices comprise an oscillograph and a signal transmitting cable. The oscillograph is electrically connected to the SAS connector through the signal transmitting cable for testing SAS signals of the mother board. The signal transmitting cable has probes at one end for connecting to the contact terminals of the SAS connector, and the other end is directly connected to the oscillograph. It is difficult and time-consuming to accurately align the probes with the contact terminals.

Therefore, it is desirable to provide a SAS signal testing device, which can overcome the above-mentioned limitations.

DETAILED DESCRIPTION

Embodiments of the present disclosure will now be described in detail with reference to the drawings.

Figure 1:
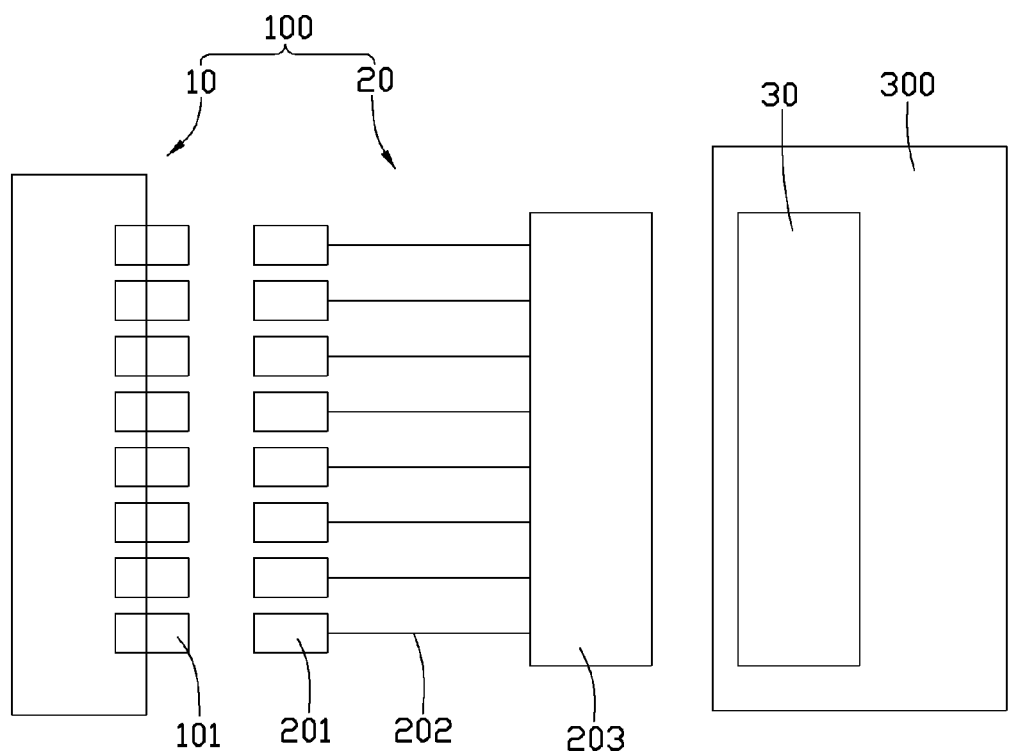
FIG. 1 is a diagram showing a SAS signal testing device, according to an exemplary embodiment.

Referring to FIG. 1, a SAS signal testing device 100, according to an exemplary embodiment, comprises an oscillograph 10 and a signal transmitting cable 20 for connecting the oscillograph 10 to a computer mother board 300.

The oscillograph 10 is configured for testing SAS signals of the mother board 300. The oscillograph 10 has a plurality of first connection ports 101 for connecting with the signal transmitting cable 20.

The signal transmitting cable 20 is configured for connecting the mother board 300 to the oscillograph 10. The signal transmitting cable 20 comprises a plurality of second connection ports 201, a plurality of coaxial cables 202, and a SAS connector 203. The number of the coaxial cables 202 is equal to that of the second connection ports 201. One end of each coaxial cable 202 is electrically connected to one end of a corresponding second connection port 201, and the other end is electrically connected to the SAS connector 203 by, e.g., soldering. The SAS connector 203 is configured for connecting with the mother board 300.

The mother board 300 comprises at least a second SAS connector 30. The second SAS connector 30 is configured for connecting to a hard disk (not shown).

In the present embodiment, there are eight each of the first connection ports 101, the second connection ports 201, and the coaxial cables 202.

Figure 2:
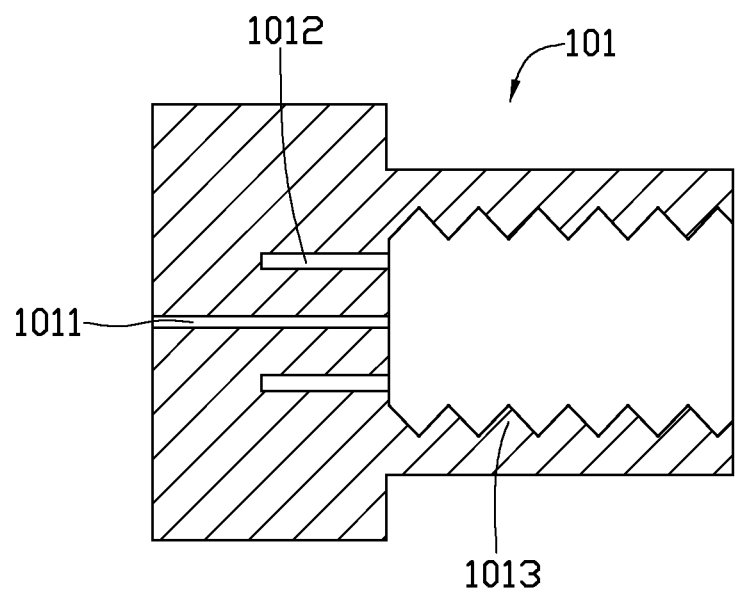
FIG. 2 is a diagram showing a female reverse polarity SMA (RP-SMA) connector of an oscillgraph of the SAS signal testing device of FIG. 1.

Referring to FIG. 2, the first connection ports 101 are female RP-SMA connectors. Each of the female RP-SMA connectors 101 is in a hollow cylinder shape and has a socket 1011 formed along a center axis thereof, an annular accommodating groove 1012 surrounding the socket 1011, and internal threads 1013.

Figure 3:
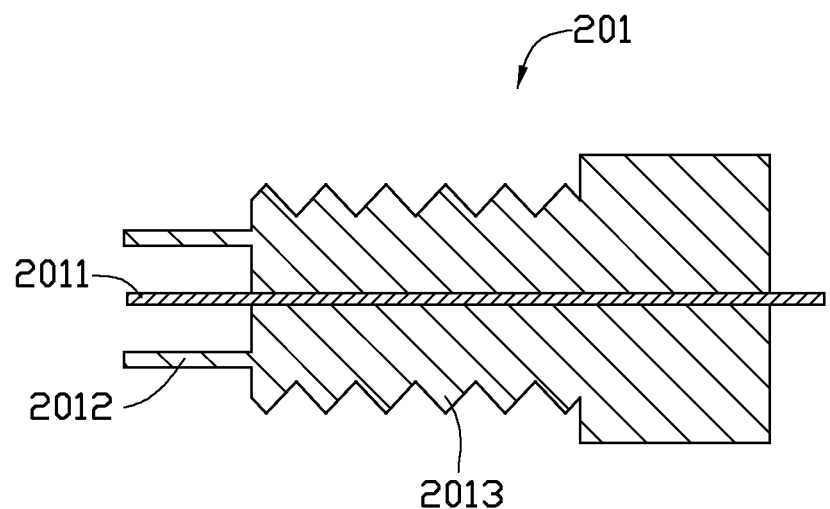
FIG. 3 is a diagram showing a male RP-SMA connector of a SAS signal transmitting cable of the SAS signal testing device of FIG. 1.

Referring to FIG. 3, the second connection ports 201 are male RP-SMA connectors corresponding to the first connection ports 101. Each male PR-SMA connector is in a cylinder shape and has a pin 2011 formed along a center axis thereof, an annular front end 2012 surrounding the pin 2011, and external threads 2013.

The socket 1011 is configured for engaging with the pin 2012. The annular accommodating groove 1012 is configured for accommodating the annular front end 2012. The internal threads 1013 are configured for engaging with the external threads 2013.

Alternatively, the first connection ports 101 can be male RP-SMA connectors, and the second connection ports 201 can be female RP-SMA connectors corresponding to the first connection ports 101.

When using the SAS signal testing device 100 to test the mother board 300, the first connection ports 101 are electrically engaged with the second connection ports 201. The first SAS connector 203 is connected to the second SAS connector 30. The oscillograph 10 can then be used to test SAS signals of the motherboard.

The impendence of each of the female RP-SMA connectors or the male RP-SMA connectors is about 90.11926 ohms to 100.0917 ohms The insertion loss between the female RP-SMA connectors and the male RP-SMA connectors is about 0.81425 dB in the frequency of about 3 GHz, and about 0.87483 dB in the frequency of about 4 GHz. The maximum value of the insertion loss between the female RP-SMA connectors and the male RP-SMA connectors is about 1.605 dB in the frequency of about 3.7 GHz. Thus, the female RP-SMA connectors or the male RP-SMA connector can decline electromagnetic interference. The signal testing device 100 can conveniently and exactly test the SAS signals of the mother board 30.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A signal testing device, comprising:
an oscillograph having a plurality of first connection ports; and
a signal transmitting cable comprising a plurality of second connection ports, a plurality of coaxial cables and an SAS connector configured for connecting to a mother board,
wherein one end of each coaxial cable is electrically connected to one end of a corresponding second connection port, and the other end is electrically connected to the SAS connector, the first connection ports are configured for engaging with the second connection ports,
wherein the first connection ports are female RP-SMA connectors, each of the female RP-SMA connectors is a hollow cylinder shape and defines a socket along a center axis thereof and internal threads, impedance of each of the female RP-SMA connectors is about 90.11926 ohms to 100.0917 ohms.

2. The signal testing device of claim 1, wherein the second connection ports are male RP-SMA connectors, each of the male RP-SMA connectors is a cylinder shape and has a pin formed along a center axis thereof, and external threads, the pin is configured for being received in the socket, the external threads are configured for engaging with the internal threads.

3. The signal testing device of claim 2, wherein each of the female RP-SMA connectors defines an annular accommodating groove surrounding the socket, each of the male RP-SMA connectors has an annular front end surrounding the pin, the annular front end is configured for being received in the annular accommodating groove.

4. The signal testing device of claim 2, wherein impedance of each of the male RP-SMA connectors is about 90.11926 ohms to 100.0917 ohms.

5. The signal testing device of claim 2, wherein insertion loss between the female RP-SMA connectors and the male RP-SMA connectors is about 0.81425 dB in a frequency of about 3 GHz.

6. The signal testing device of claim 2, wherein insertion loss between the female RP-SMA connectors and the male RP-SMA connectors is about 0.87483 dB in a frequency of about 4 GHz.

7. The signal testing device of claim 2, wherein a maximum value of insertion loss between the female RP-SMA connectors and the male RP-SMA connectors is about 1.605 dB in a frequency of about 3.7 GHz.

8. The signal testing device of claim 1, wherein the number of the first connection ports is eight.

9. The signal testing device of claim 8, wherein the number of the second connection port is eight.

10. The signal testing device of claim 9, wherein the number of the coaxial cables is eight.

11. The signal testing device of claim 1, wherein the second connection ports are electrically connected to the coaxial cables by soldering.

12. A signal transmitting cable comprising:
a plurality of connection ports;
a plurality of coaxial cables; and
a SAS connector configured for connecting to a mother board,
wherein one end of each coaxial cable is electrically connected to a corresponding one of the connection ports, and the other end is electrically connected to the SAS connector,
wherein the connection ports are male RP-SMA connectors, each of the male RP-SMA connectors is in a cylinder shape and has a pin formed along a center axis thereof, and external threads, impedance of each of the male RP-SMA connectors is about 90.11926 ohms to 100.0917 ohms.

13. The signal transmitting cable of claim 12, wherein the number of the connection port is eight.

14. The signal transmitting cable of claim 13, wherein the number of the coaxial cables is eight.

* * * * *